(12) United States Patent
Mukaitani et al.

(10) Patent No.: US 10,215,813 B2
(45) Date of Patent: Feb. 26, 2019

(54) STORAGE BATTERY STATE MONITORING SYSTEM, STORAGE BATTERY STATE MONITORING METHOD, AND STORAGE BATTERY STATE MONITORING PROGRAM

(71) Applicant: Hitachi Chemical Company, LTD., Tokyo (JP)

(72) Inventors: Ichiro Mukaitani, Tokyo (JP); Takeo Sakamoto, Tokyo (JP); Yoshiaki Itoh, Tokyo (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 0 days.

(21) Appl. No.: 15/524,180

(22) PCT Filed: Nov. 6, 2015

(86) PCT No.: PCT/JP2015/081285
§ 371 (c)(1),
(2) Date: May 3, 2017

(87) PCT Pub. No.: WO2016/072487
PCT Pub. Date: May 12, 2016

(65) Prior Publication Data
US 2017/0350946 A1 Dec. 7, 2017

(30) Foreign Application Priority Data
Nov. 6, 2014 (JP) .................................. 2014-225768

(51) Int. Cl.
*G01N 27/416* (2006.01)
*G01R 31/36* (2006.01)
(Continued)

(52) U.S. Cl.
CPC ......... *G01R 31/3679* (2013.01); *G01R 31/36* (2013.01); *G01R 31/3624* (2013.01);
(Continued)

(58) Field of Classification Search
CPC ............ G01R 31/3624; G01R 31/3606; G01R 31/3679; G01R 31/3658; G01R 31/3689;
(Continued)

(56) References Cited

U.S. PATENT DOCUMENTS

2005/0017686 A1    1/2005  Sakakibara et al.
2007/0182373 A1    8/2007  Sakakibara et al.
(Continued)

FOREIGN PATENT DOCUMENTS

JP    2005-026153 A    1/2005
JP    2008-309796 A    12/2008
(Continued)

OTHER PUBLICATIONS

Kiyoshi Takahashi, Shigeru Nagashima, "Development of Noise Solution Type Battery Condition Watcher (BCW)" in FB Technical News No. 63 (Nov. 2007), The Furukawa Battery Co., Ltd., Nov. 2007, pp. 32 to 37.

(Continued)

*Primary Examiner* — Minh N Tang
(74) *Attorney, Agent, or Firm* — Fitch, Even, Tabin & Flannery LLP

(57) ABSTRACT

In a state monitoring of a storage battery, accuracy of estimation of the remaining service life of the storage battery can be improved by monitoring the state of the storage battery and distinguishing an initial failure and an accidental failure from degradation over time. A storage battery state monitoring system which monitors a state of each of a plurality of storage batteries connected in series and constituting an assembled battery provided in an apparatus, the system includes a control/power supply device which detects a current in each of the storage batteries, and a slave device which measures an operation time, a temperature, a voltage, and an internal resistance of each of the storage (Continued)

batteries, the internal resistance being measured at at least two or more kinds of frequencies, and in a state that is not normal in each of the storage batteries is determined by distinguishing an initial failure or an accidental failure from degradation over time based on at least one or more values of the temperature, the voltage, and the internal resistance measured by the slave device and a direct current resistance of each of the storage batteries obtained from a ratio between a change in a current value detected by the control/power supply device and a change in a voltage value measured by the slave device during discharging of each of the storage batteries.

18 Claims, 6 Drawing Sheets

(51) Int. Cl.
*H02J 7/00* (2006.01)
*H02J 7/02* (2016.01)
*H01M 2/10* (2006.01)
*H01M 10/48* (2006.01)
*H01M 10/42* (2006.01)

(52) U.S. Cl.
CPC ..... *G01R 31/3658* (2013.01); *G01R 31/3662* (2013.01); *H01M 2/1077* (2013.01); *H01M 10/425* (2013.01); *H01M 10/482* (2013.01); *H01M 10/486* (2013.01); *H02J 7/00* (2013.01); *H02J 7/02* (2013.01); *H01M 2220/10* (2013.01)

(58) Field of Classification Search
CPC ...... H02J 7/007; H02J 7/0021; H01M 10/482; H01M 10/4257; B60L 11/1855; B60L 11/1879; B60L 11/1866
See application file for complete search history.

(56) References Cited

U.S. PATENT DOCUMENTS

| | | | |
|---|---|---|---|
| 2009/0096459 A1* | 4/2009 | Yoneda | G01R 31/3651 324/430 |
| 2011/0031048 A1* | 2/2011 | Ohkura | G01R 31/3658 180/65.1 |
| 2012/0175953 A1* | 7/2012 | Ohkawa | B60L 3/0046 307/18 |
| 2014/0285156 A1 | 9/2014 | Mukaitani et al. | |
| 2014/0306667 A1 | 10/2014 | Mukaitani et al. | |
| 2014/0312915 A1 | 10/2014 | Mukaitani et al. | |

FOREIGN PATENT DOCUMENTS

| | | |
|---|---|---|
| JP | 2011-076746 A | 4/2011 |
| JP | 2013-085386 A | 5/2013 |
| JP | 2014-022282 A | 2/2014 |
| JP | 5403191 B2 | 4/2015 |
| WO | 2013/069346 A1 | 5/2013 |
| WO | 2013/084353 A1 | 6/2013 |

OTHER PUBLICATIONS

International Search Report for PCT/JP2015/081285 dated Dec. 6, 2015; English translation submitted herewith (5 pages).

* cited by examiner

STORAGE BATTERY STATE MONITORING SYSTEM, STORAGE BATTERY STATE MONITORING METHOD, AND STORAGE BATTERY STATE MONITORING PROGRAM

CROSS-REFERENCE TO RELATED APPLICATIONS

This application is a U.S. national phase application filed under 35 U.S.C. § 371 of International Application No. PCT/JP2015/081285, filed Nov. 6, 2015, designating the United States, and claims priority from Japanese Patent Application No. 2014-225768, filed Nov. 6, 2014, and the complete disclosures of which applications are hereby incorporated herein by reference in their entirety for all purposes.

TECHNICAL FIELD

The present invention relates to a technique for monitoring a state of a storage battery, and particularly relates to a technique effectively applied to a storage battery state monitoring system, a storage battery state monitoring method, and a storage battery state monitoring program in which a state of a storage battery constantly connected to an apparatus for use in backup power, output fluctuation, and the like is monitored and estimated by applying power thereto.

BACKGROUND ART

In an important device, system, or the like required to be constantly in operation, in order to continue to supply power to a load even when power supply from a commercial power source is interrupted due to blackout, an instantaneous power interruption, or the like (or power from a commercial power source is not or cannot be used and these cases may be hereinafter collectively referred to as "emergency situation or the like"), a UPS (Uninterruptible Power Supply) is sometimes used. The UPS has a storage battery which accumulates power to be supplied to a load in an emergency situation or the like, and a single UPS may have a plurality of storage batteries.

The storage battery used in the UPS is kept in a charged state and does not operate (discharge) in a normal situation, and operates in an emergency situation or the like so as to supply power to a load. It has been known that the storage battery degrades over time even in a non-operation state and that the degradation is accelerated generally as an ambient temperature becomes higher. Accordingly, in the case of an apparatus on which the storage battery such as the UPS is mounted, in order to prevent occurrence of the case in which the apparatus does not operate normally due to the dead battery, a failure of the storage battery or the like at the time of operation, such a method has been taken in which the state of the storage battery is monitored and the remaining battery life is predicted in consideration of the degradation caused by the ambient temperature or the service years, and the storage battery is replaced with a new storage battery before the storage battery reaches the predicted end of its service life, even when the storage battery is currently in an abnormal state as a matter of course as well as even when the storage battery is in a normal state.

However, in the simple prediction of the remaining life based on only a relation between the temperature and a degree of degradation, accuracy of the prediction of the remaining life is not so high, and accordingly, as a result of taking safety into consideration, the storage battery is replaced considerably earlier than the actual end of service life, so that the storage battery may not effectively used up, causing an inefficient state from the viewpoint of both of economical use and effective use.

As a technique for solving the above-mentioned problems, for example, Japanese Patent Application Laid-Open Publication No. 2005-26153 (Patent Document 1) discloses a storage battery monitoring system which detects a temperature T of an assembled battery composed of a plurality of storage batteries, measures a voltage E and an internal resistance R of each of the storage batteries, and determines the service life of each of the storage batteries based on these detection results and measurement results, so that the end of service life of the storage battery can be determined by further considering another element in addition to the relation between the temperature and the service life.

Moreover, Non-Patent Document 1 discloses a storage battery diagnosis device in which, in order to monitor a state of a lead storage battery used in a UPS, a cell voltage, an internal impedance, a temperature are consecutively measured, and in the measurement of the internal impedance, the internal impedance is measured at a frequency different from a frequency component of a ripple current generated from the UPS, so that an influence of normal mode noises generated from the UPS is suppressed and the measurement value of the internal impedance can be stably obtained.

Furthermore, Japanese Patent No. 5403191 (Patent Document 2) relating to the invention by the inventors of the present application discloses a storage battery state monitoring system which includes a control/power supply device detecting a current in each of the storage batteries and a slave device measuring a temperature, a voltage, and an internal resistance of each of the storage batteries, the internal resistance being measured at at least two or more kinds of frequencies, and which estimates degradation of each of the storage batteries based on at least one or more values of the temperature, the voltage, and the internal resistance measured by the slave device and a DC (direct current) resistance of each of the storage batteries obtained from a ratio between a change in a current value detected by the control/power supply device and a change in a voltage value measured by the slave device during discharging of each of the storage batteries.

RELATED ART DOCUMENTS

Patent Documents

Patent Document 1: Japanese Patent Application Laid-Open Publication No. 2005-26153
Patent Document 2: Japanese Patent No. 5403191

Non-Patent Document

Non-Patent Document 1: Kiyoshi Takahashi, Shigeru Nagashima, "Development of Noise Solution Type Battery Condition Watcher (BCW)" in FB Technical News No. 63 (2007.11), The Furukawa Battery Co., Ltd., November 2007, pp. 32 to 37

SUMMARY OF THE INVENTION

Problems to be Solved by the Invention

By using a device and a system for monitoring the state or the like of the storage battery as disclosed in Patent Document 1 and Non-Patent Document 1, it is possible to estimate the state and the service life of each of the storage batteries by measuring and acquiring parameters such as the temperature, the voltage, the internal resistance, and the like. Moreover, by using a system disclosed in Patent Document 2, various parameters including internal resistance values at a plurality of frequencies are automatically acquired with respect to a large number of storage batteries, so that prediction of the state and the service life of each of the storage batteries can be efficiently carried out with high accuracy.

Meanwhile, a possible failure and trouble in the storage battery are not limited to those caused by degradation over time, but an initial failure and an accidental failure may also occur. Regarding this, the above-mentioned conventional technique is designed to predict the state and the service life of the storage battery based on whether a measured numeric value such as a voltage is normal or abnormal, and in the conventional technique, no distinction is basically made between the failure and trouble caused by degradation over time and troubles having many variations among individual devices, such as the initial failure and accidental failure. However, a large error in the estimation of the remaining service life may actually occur depending on whether an occurred failure is an initial failure, an accidental failure, or an abnormality caused by degradation over time, and in most cases, determination of these is carried out by adding thereto the determination of a skilled worker based on his or her experience and intuition.

Accordingly, an object of the present invention is to provide a storage battery state monitoring system, a storage battery state monitoring method, and a storage battery state monitoring program in which accuracy of estimation of the remaining service life of a storage battery can be improved in a state monitoring of the storage battery by monitoring the state of the storage battery and distinguishing an initial failure and an accidental failure from degradation over time.

The above-described and other objects and novel characteristics of the present invention will be apparent from the description of the present specification and the accompanying drawings.

Means for Solving the Problems

An outline of the typical ones of the inventions disclosed in the present application will be briefly described as follows.

According to a typical embodiment of the present invention, a storage battery state monitoring system which monitors a state of each of a plurality of storage batteries connected in series and constituting an assembled battery provided in an apparatus, the system includes current detecting means which detects a current in each of the storage batteries, and state measuring means which measures an operation time, a temperature, a voltage, and an internal resistance of each of the storage batteries, the internal resistance being measured at at least two or more kinds of frequencies.

Then, a state that is not normal in each of the storage batteries is determined by distinguishing an initial failure or an accidental failure from degradation over time based on at least one or more values of the temperature, the voltage, and the internal resistance measured by the state measuring means and a DC resistance of each of the storage batteries obtained from a ratio between a change in a current value detected by the current detecting means and a change in a voltage value measured by the state measuring means during discharging of each of the storage batteries.

Moreover, the present invention is also applicable to a storage battery state monitoring program for causing a computer to execute processes so as to function as the storage battery state monitoring system described above.

Effects of the Invention

Effects obtained by the typical ones of the inventions disclosed in the present application will be briefly described as follows.

That is, according to a typical embodiment of the present invention, in a state monitoring of a storage battery, accuracy of estimation of the remaining service life of the storage battery can be improved by monitoring the state of the storage battery and distinguishing an initial failure and an accidental failure from degradation over time.

BRIEF DESCRIPTIONS OF THE DRAWINGS

DETAILED DESCRIPTION OF PREFERRED EMBODIMENT

Figure 1:
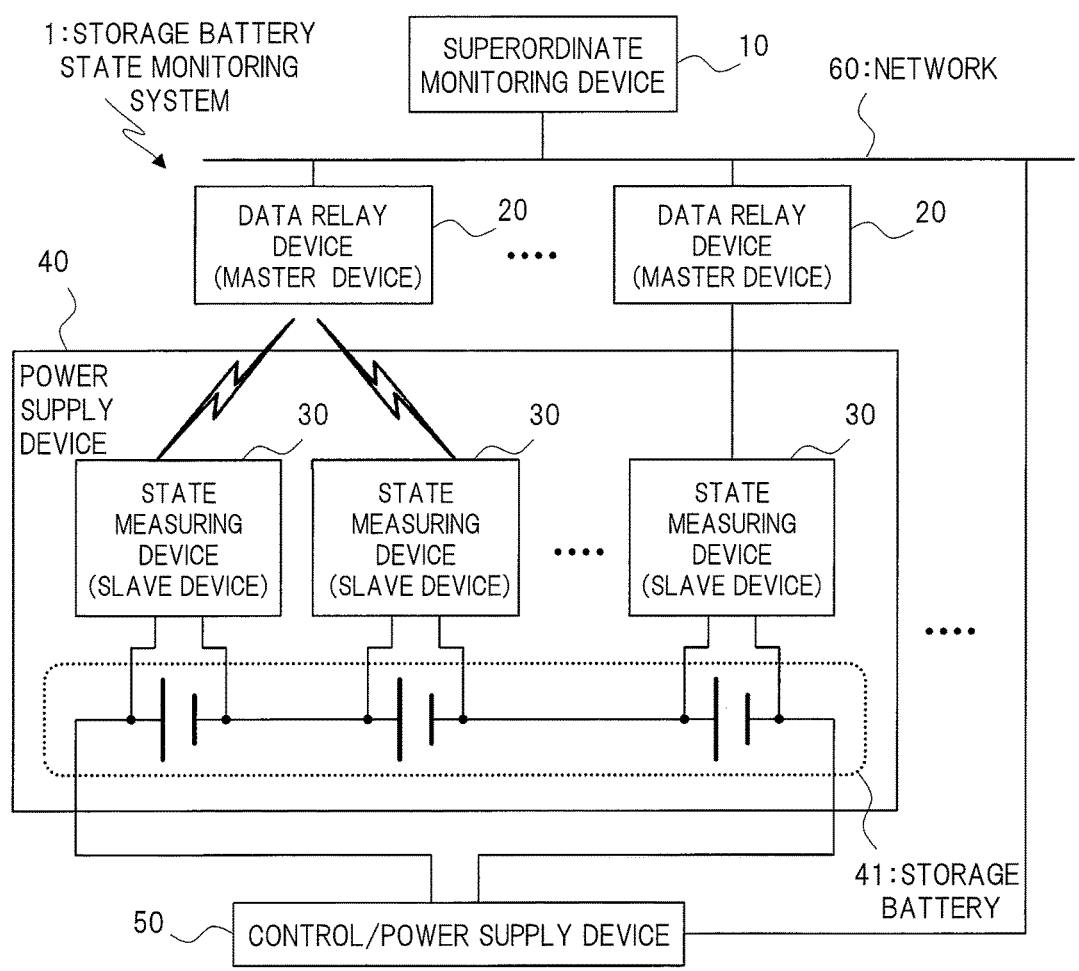
FIG. 1 is a diagram showing an outline of a configuration example of a storage battery state monitoring system according to one embodiment of the present invention.

Hereinafter, an embodiment of the present invention will be described in detail with reference to the accompanying drawings. Note that components having the same function are denoted by the same reference characters throughout the drawings for describing the embodiment, and the repetitive description thereof is omitted.

<System Configuration>

FIG. 1 is a diagram showing an outline of a configuration example of a storage battery state monitoring system according to one embodiment of the present invention. The storage battery state monitoring system 1 is a system in which various parameters of a plurality of storage batteries 41 connected in series and constituting an assembled battery provided in an apparatus such as a power supply device 40 are automatically measured or acquired by applying power to each of the storage batteries 41, thereby estimating a state and a service life of each of the storage batteries 41.

This storage battery state monitoring system 1 includes state measuring devices 30 each of which is fixedly installed to each of the storage batteries 41 of one or more power supply devices 40 and measures various parameters such as a temperature, a voltage, and an internal resistance of the corresponding storage battery 41, and a superordinate monitoring device 10 which collects data measured by the state measuring devices 30 and comprehensively carries out a process of estimating the state and the service life of the storage battery 41. Moreover, the storage battery state monitoring system 1 further includes data relay devices 20 which are disposed between the superordinate monitoring device 10 and the state measuring devices 30, and relay the measurement data transmitted from each of the state measuring devices 30 to transmit the data to the superordinate monitoring device 10.

More specifically, in the present embodiment, the storage battery state monitoring system 1 has a three-layer hierarchical configuration in which M data relay devices 20 (which may be hereinafter referred to as "master device") are connected to one superordinate monitoring device 10 so as to enable communication therebetween and N state measuring devices 30 (which may be hereinafter referred to as "slave device") are connected to the data relay device 20 so as to enable communication therebetween. The superordinate monitoring device 10 and the master devices 20 are connected by a wired communication via a network 60 such as LAN (Local Area Network), and the master devices 20 and the slave devices 30 are connected by a wireless communication. Note that standards, protocols, and the like for the wired and the wireless communications are not particularly limited and known techniques can be used appropriately.

Thus, in an apparatus such as the power supply device 40 or the like including a large number of storage batteries 41, the slave device 30 can be installed for each of the storage batteries 41 without requiring external wirings or the like, so that easiness and flexibility in installation can be improved so as to allow the devices to be installed more efficiently and risks of trouble caused by erroneous wire connection, time-dependent degradation of wirings, and the like can be reduced.

Note that, in the present embodiment, although the master device 20 at least has a function of converting a communication protocol between the wireless communication with the slave device 30 and the wired communication with the superordinate monitoring device 10, master device 20 does not need to have other functions. At this time, the master device 20 may carry out the wireless communication with each slave device 30 concurrently or sequentially. Moreover, depending on a scale or the like of the storage battery state monitoring system 1 (for example, the number of the storage batteries 41 to be monitored), the system may have a two-layer configuration in which no master device 20 is provided and the slave devices 30 directly communicate with the superordinate monitoring device 10 and may have another configuration in which the communication between the slave device 30 and the master device (or the communication between the slave device 30 and the superordinate monitoring device 10) is not limited to the wireless communication as shown in FIG. 1 and the wired communication may be used.

To each of the power supply devices 40, a control/power supply device (a power conditioning system (PCS), or an uninterruptible power supply (UPS), or a DC power supply device) 50 which controls power supply to a load such as an apparatus or a system using the power supply device 40 is connected. The control/power supply device 50 controls the power supply to the load from the power supply device 40 and has a function as a current detector capable of detecting a current value flowing through the storage batteries 41 installed in series with one another in the power supply device 40, and the control/power supply device 50 can acquire information about the presence/absence of charging and discharging of the power supply device 40 (storage battery 41). The control/power supply device 50 is connected to, for example, a network 60, and the superordinate monitoring device 10 can acquire information or the like relating to the current value and the presence/absence of charging and discharging of the storage battery 41 of the power supply device 40 from the control/power supply device 50 via the network 60.

Note that, in the configuration of the present embodiment, the control/power supply device 50 detects the current value of each storage battery 41 and the superordinate monitoring device 10 can acquire the corresponding information from the control/power supply device 50; however, the configuration is not limited thereto, and for example, it is also possible to adopt the configuration in which the slave device 30 to be described later may measure the current value of each storage battery 41 in the same manner as the other parameters such as the temperature and the voltage and transmit the information to the superordinate monitoring device 10.

Figure 2:
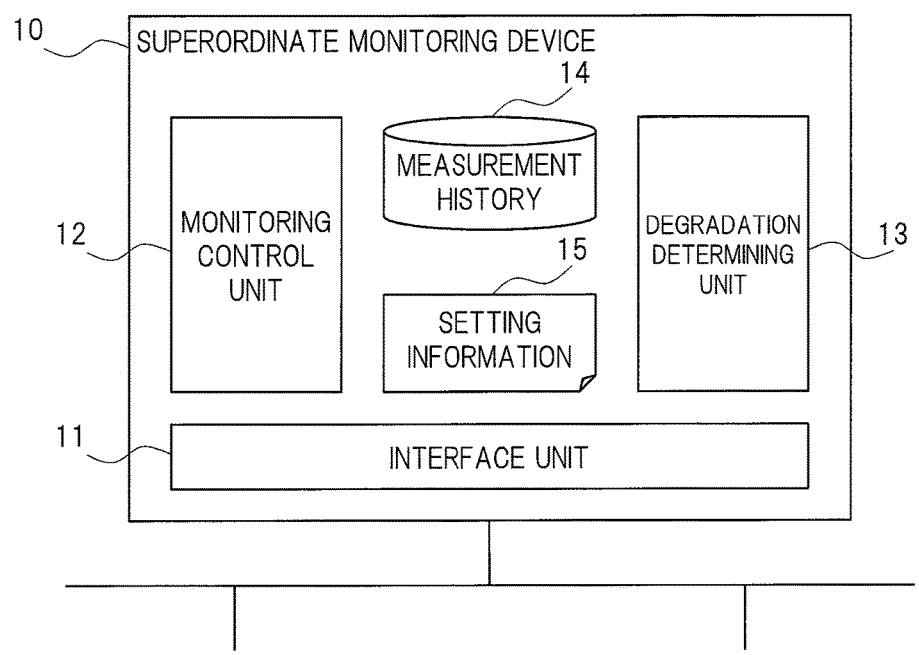
FIG. 2 is a diagram showing an outline of a configuration example of a superordinate monitoring device according to the one embodiment of the present invention.

FIG. 2 is a diagram showing an outline of a configuration example of the superordinate monitoring device 10. The superordinate monitoring device 10 collects the information of the measured various parameters of each storage battery 41 from each slave device 30 via the master device 20, estimates the state and the service life of each storage battery 41 based on the collected data, and monitors the presence/absence of an abnormal state and arrival of an end of service life.

The superordinate monitoring device 10 is constituted by an information processing device such as, for example, a PC (Personal Computer) or a server apparatus and includes various units such as an interface unit 11, a monitoring control unit 12, and a degradation determining unit 13 which are implemented as software programs running on middleware such as OS (Operating System) and DBMS (Database Management System), not shown. Moreover, the superordinate monitoring device 10 further includes a measurement history 14 serving as a database which accumulates the measurement data collected from the slave device 30 and setting information 15 composed of files, registries, and the like which hold various settings relating to operations of the storage battery state monitoring system 1.

The interface unit 11 has a function as a user interface which provides, to the user, a screen on which the user inputs various instructions, and a screen on which results of the state monitoring of the storage battery 41 are displayed. It is also possible to adopt the configuration in which the screen is displayed by having an access from a Web browser on the client terminal of the user by a Web server program not shown. The various instructions input by the user include, for example, an instruction to specify operation conditions for the superordinate monitoring device 10 and the slave device 30 which are set as the setting information 15 and an instruction to measure and collect data to the slave device 30 based on a request from the user.

The monitoring control unit 12 sends a request for specifying conditions for measurement of various parameters and executing the measurement to the slave device 30 (via the master device 20) in accordance with the setting contents registered in the setting information 15 or an instruction from the user via the interface unit 11. Also, the monitoring control unit 12 has a function of collecting measurement data by requesting the slave device 30 to transmit the measurement data of the various parameters and accumulating the measurement data by recording the data for each storage battery 41 in the measurement history 14.

Note that, in a case in which there are a large number of storage batteries 41 to be monitored, for example, when a data measurement instruction is sent simultaneously to the slave devices 30, a large number of slave devices 30 carry out the measurement for the storage batteries 41 simultaneously. Since the slave device 30 applies power to the storage battery 41, though the power is minute, at the time of measuring parameters, a voltage drop occurs, and it may therefore exert an adverse effect on the power supply device 40 when a large number of slave devices 30 simultaneously carry out the measurement. Also, when a transmission request of the measurement data is sent simultaneously to the slave devices 30, the slave devices 30 each transmit the measurement data simultaneously to the superordinate monitoring device 10 via the master devices 20, with the result that a large communication load may be applied to the master device 20 and the superordinate monitoring device 10.

Therefore, in the present embodiment, when instructions to measure various parameters (in particular, measurement of the internal resistance), transmit the measurement data, and the like are sent to the slave devices 30, the slave devices 30 are divided into groups each having a proper number of slave devices 30 (e.g., 30% of the entire slave devices 30), and the instruction is sent automatically or manually to each group of the slave devices 30 with sufficient time differences in such a manner that timings of processing by the slave devices 30 belonging to the respective groups do not overlap with each other.

The degradation determining unit 13 estimates the state and the remaining service life of the storage battery 41 in accordance with the setting contents registered in the setting information 15 or an instruction from the user via the interface unit 11 based on the measurement values of the various parameters such as the temperature, the voltage, and the internal resistance collected from the slave devices 30 and recorded in the measurement history 14, and the current values and the like acquired from the control/power supply device 50 at the time of discharging and charging in the power supply device 40.

At this time, by determining an initial failure and an accidental failure in a distinguished manner from degradation over time, and by comprehensively taking these factors into consideration, the state and the service life are estimated. More specifically, in the present embodiment, in determining the soundness and the remaining service life of the storage battery 41, detection of abnormality/failure such as the initial failure and the accidental failure (that is, detection of a storage battery 41 that degrades earlier than the normal state), and detection of degradation over time (that is, an end of service life of the storage battery 41) are determined in a distinguished manner, and by comprehensively taking these factors into consideration, the remaining service life of the corresponding storage battery 41 (that is, replacement time of the corresponding storage battery 41) is estimated.

In general, the abnormality/failure such as an initial failure and an accidental failure tends to occur many times in the initial stage, and a rate of occurrence tends to be decreased as time passes. Moreover, measurement parameters such as a voltage and an internal resistance tend to fluctuate abruptly at random. In contrast, the degradation over time proceeds linearly or moderately, and when a threshold value is exceeded (or after a lapse of a fixed period or more), the degradation tends to occur abruptly. Therefore, in the present embodiment, with respect to the initial failure and the accidental failure, determination of the measurement parameter is made based on a deviation from the average value or the like as a whole, and with respect to the degradation over time, the determination is made by comparing the present state with a characteristic curve stored in advance.

More specifically, in the present embodiment, degradation is determined multilaterally based on a plurality of parameters including a voltage, an internal resistance (mainly, corresponding to an AC (alternate current) impedance with a reactance of the battery being included at the time of measurement; however, in the following description, collectively referred to as "internal resistance") and a DC resistance at the time of discharging/charging, in addition to determination based on a temperature of the storage battery 41. For example, with regard to the temperature and the voltage, as the management of the abnormal values including those caused by an unexpected failure such as an initial failure and an accidental failure, it is determined that the storage battery 41 is in an abnormal state when the value of the temperature or the voltage of the storage battery 41 acquired at a fixed interval (e.g., five minutes) exceeds a predetermined threshold value obtained based on an average value and the like. Specifically, for example, when the temperature of the storage battery 41 exceeds the room temperature by +10° C., it is determined that the storage battery 41 is in a slight abnormal state, and when the temperature of the storage battery exceeds the room temperature by +20° C., it is determined that the storage battery 41 is in a state where immediate replacement is needed. Also, in addition to the above management, degradation over time may be determined based on a table or an equation indicating a correlation between the temperature and the service life.

Also, as a tendency management in a normal situation, the internal resistance is measured at regular cycles such as once a day or at the timing of reception of a user instruction, for example, and the degradation of the storage battery 41 is estimated based on the characteristic curve in accordance with a change rate from an initial value of the internal resistance (e.g., an internal resistance value measured for the first time at the installation of the storage battery 41). For example, when the internal resistance value increases from the initial value by 20% or more, the system determines that the storage battery is in a slightly degraded state, when the internal resistance value increases from the initial value by 50% or more, the system determines that the storage battery needs to be replaced in an early opportunity (e.g., within a year), and when the internal resistance value increases from the initial value by 100% or more, the system determines that the storage battery must be replaced immediately. Since an absolute value of an internal resistance varies depending on a type of the storage battery 41, determination based on a relative value is carried out as described above.

Note that, in the present embodiment, in order to estimate the service life more accurately corresponding to various degradation modes of the storage battery 41, the internal resistance is measured at a plurality of frequencies, and the above-mentioned determination based on a relative value to the initial value is carried out for each internal resistance measured at each frequency. A conventional measuring apparatus for an internal resistance generally uses a frequency of about 1 kHz, and it has been known that the gradual degradation of the storage battery 41 can be determined to some extent based on the internal resistance measured at this frequency. Also, since this frequency has been used widely and lots of reference data involving the frequency have been accumulated, the frequency of about 1 kHz (e.g., 350 Hz or higher to lower than 2000 Hz) is used as one of the frequencies in the present embodiment.

Meanwhile, the frequency of about 1 kHz is too high as a frequency for obtaining information about a power-generating element such as an electrode reaction, and only the information merely capable of determining whether the storage battery is dead or alive can be obtained. Therefore, for obtaining more detailed information, it is preferable to further measure the internal resistance at a frequency of direct current or a lower frequency close to a direct current. In the present embodiment, a DC resistance component is acquired by automatically detecting the timing at which the UPS is operated and the storage battery 41 starts discharging and charging and by calculating a ratio of respective changes (slope) of a current value and a voltage value during discharging based on a voltage value and a current value (larger than those at the measurement of an internal resistance at AC) sequentially measured during discharging or charging of the storage battery by the measuring devices installed for respective storage batteries. By comparing that with the initial value in the same manner as described above, the degradation of the storage battery 41 can be determined more accurately.

However, since the apparatus such as the UPS stands by or is not in operation in a normal situation, there is only a limited timing for measuring the DC resistance in the above-mentioned manner. For this reason, the internal resistance at a low frequency is also measured in the normal situation (in which the storage battery 41 is not discharging or charging). For example, a frequency of about lower than 100 Hz (not an integral multiple of 50 Hz or 60 Hz) is used because the frequency brings no actual problem to the configuration of the system and does not interfere with the commercial power source. For further improvement of accuracy of the degradation determination, it is preferable to measure the internal resistance at additional different frequencies.

Therefore, in the present embodiment, frequencies for measuring the internal resistance include at least the high frequency of about 1 kHz (e.g., 350 Hz or higher to lower than 2000 Hz) and the low frequency of less than 100 Hz (which does not interfere with the commercial power source) and further include an intermediate frequency (e.g., 100 Hz or higher to lower than 350 Hz) different from those frequencies, and the internal resistance is measured by using these three kinds of frequencies, as described later.

For more general description, for example, by measuring the internal resistance at a plurality of frequencies obtained by selecting at least one or more frequencies from each of a low frequency range of lower than 200 Hz and a high frequency range of 200 Hz or higher to lower than 2000 Hz, the accuracy of degradation determination can be improved. The accuracy of degradation determination can be further improved by measuring the internal resistance by adding other frequencies selected from the above-mentioned frequency ranges.

In this manner, in the present embodiment, the degradation of the storage battery 41 is estimated at mainly three timings described above. Firstly, the abnormality including an unexpected failure and the service life of the storage battery 41 are estimated based on acquired data of the temperature and the voltage measured consecutively at fixed time intervals (five minutes in the present embodiment). Secondly, a degradation tendency of the storage battery 41 in a plurality of degradation modes is estimated based on the measurement values of the internal resistance measured at a plurality of frequencies at regular cycles (once a day in the present embodiment) or an arbitrary timing in accordance with a user instruction. Thirdly, the degradation tendency of the storage battery 41 is estimated with higher accuracy at the timing of discharging or charging of the storage battery 41 based on a DC resistance calculated from measurement data of the voltage in discharging or charging and a DC current value at the time of discharging or charging acquired from the control/power supply device 50.

Note that the initial values of the internal resistance and the DC resistance may be acquired from the first measurement data of the storage battery 41 to be measured in the measurement history 14 or may be separately recorded for each storage battery 41.

When it is determined as a result of the estimation of the state and the degradation of the storage battery 41 that the end of service life of the storage battery 41 has arrived or the storage battery 41 needs to be replaced because the end of its service life is close, for example, the determination is imparted together with information of measurement data, estimation result, and the like to the user via the interface unit 11.

In the setting information 15, as the setting contents related to the operation of the storage battery state monitoring system 1, for example, an interval of measurement of the temperature and the voltage by the slave device 30 (e.g., every 10 to 200 msec. and every 100 msec. in the present embodiment), an interval of collection of measurement data of the temperature and the voltage by the superordinate monitoring device 10 (e.g., every five minutes), and an interval of measurement of the internal resistance (e.g., once a day) may be set or changed by the user, an administrator, and the like. In addition, as described later, a threshold value of voltage drop and the number of consecutive cycles by which the slave device 30 detects discharging of the power supply device 40 (storage battery 41), information of a time range in which the measurement data of the voltage is locked when discharging is detected, and an operation mode of the slave device 30 (normal mode and power-saving mode), and the like may also be set.

Note that, by storing the settings relating to the operation of the slave device 30 in the setting information 15 of the superordinate monitoring device 10 so as to make it possible to specify the settings to the slave device 30 from the monitoring control unit 12, separate works to a large number of slave devices 30 become unnecessary, so that operation conditions of the slave devices 30 can be specified and changed efficiently by an instruction from the superordinate monitoring device 10.

Figure 3:
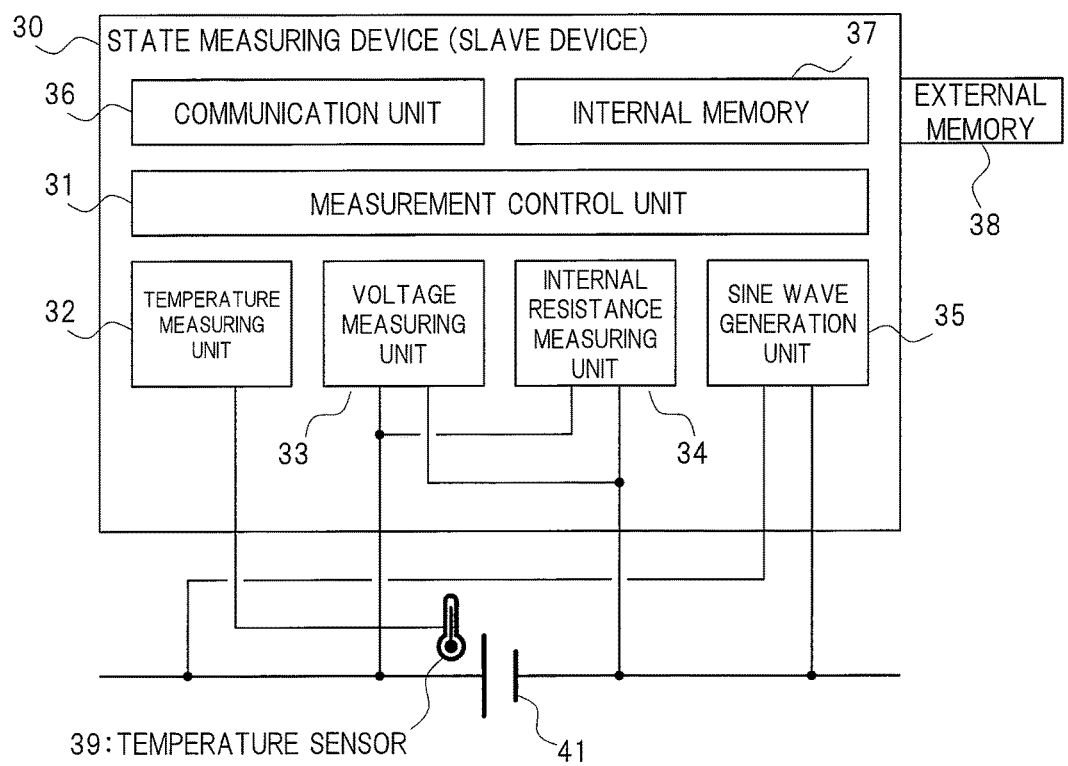
FIG. 3 is a diagram showing an outline of a configuration example of a state measuring device (slave device) according to the one embodiment of the present invention.

FIG. 3 is a diagram showing an outline of a configuration example of the state measuring device (slave device) 30. One slave device 30 is fixedly installed to a lid or the like of one storage battery 41, measures and records various parameters of the storage battery 41, and transmits measurement data to the superordinate monitoring device 10 via the master device 20 in response to an instruction from the superordinate monitoring device 10 via the master device 20. The slave device 30 is fixedly installed to the storage battery 41, whereby wiring connection with the terminals, sensors, and the like for measuring various parameters can be stabilized, so that variations in measurement data can be reduced. Note that, usually, one slave device 30 is installed to one storage battery 41, but depending on costs and voltage of the storage battery 41, some storage batteries 41 connected in series may be collectively monitored by one slave device.

The slave device 30 includes various units such as a measurement control unit 31, a temperature measuring unit 32, a voltage measuring unit 33, an internal resistance measuring unit 34, and a sine wave generation unit 35, which are implemented as software programs executed by a CPU (Central Processing Unit), circuits, and the like. Also, the slave device 30 further includes a communication unit 36 which carries out wireless communication with the master device 20 and an internal memory 37 which is a memory device composed of a nonvolatile semiconductor memory or the like. Furthermore, a temperature sensor 39 extended through wiring from the temperature measuring unit 32 is disposed in the storage battery 41, and terminals extended through wiring from the voltage measuring unit 33, the internal resistance measuring unit 34, and the sine wave generation unit 35 are connected to the positive and the negative terminals of the storage battery 41, respectively. Note that power to operate the slave device 30 is supplied from the storage battery 41. Therefore, it is preferable that the slave device 30 has a power-saving mode or the like in which the slave device 30 sleeps so as not to consume power unnecessarily except a timing when operation of each unit is needed.

The measurement control unit 31 has a function of controlling entire processing in the slave device 30 such as the measurement of the various parameters in the slave device 30, and recording and transmission of the measurement data. Each measuring unit constantly monitors the storage battery 41 (e.g., at the measurement interval of 100 msec. and the measurement cycle such as once a day) and sequentially records the measurement data in a predetermined area of the internal memory 37. At this time, old measurement data is overwritten to use the area cyclically. Also, the communication unit 36 carries out wireless communication with the master device 20, and the measurement data is transmitted to the superordinate monitoring device 10 via the master device 20 based on an instruction from the superordinate monitoring device 10 sent via the master device 20. Note that the measurement data recorded in the internal memory 37 can be taken out by copying or transferring it to an external memory 38 composed of a semiconductor memory or the like attached to the slave device 30. Also, the external memory 38 may be used as a memory area equivalent to the internal memory 37.

The temperature measuring unit 32 measures the temperature of the storage battery 41 by using the temperature sensor 39 and outputs the measurement data to the measurement control unit 31 in accordance with an instruction from the measurement control unit 31 (e.g., every 100 msec.). In addition, similarly, the voltage measuring unit 33 measures a voltage between the terminals of the storage battery 41 and outputs the measurement data to the measurement control unit 31 in accordance with an instruction from the measurement control unit 31 (e.g., every 100 msec.). At this time, as described later, when a drop (or a rise) in the voltage value continues for a certain period or longer, the measurement control unit 31 determines that the storage battery 41 is discharging (or is being charged) and locks (protects) the voltage measurement data obtained in a certain period before and after the start of discharging (or charging) in such a way that the data is not overwritten with other data and lost in the internal memory 37.

The internal resistance measuring unit 34 measures the internal resistance between the terminals of the storage battery 41 and outputs the measurement data to the measurement control unit 31 in response to an instruction from the measurement control unit 31 (e.g., once a day) as a trigger. In this measurement, the sine wave generation unit 35 generates sine waves of a plurality of frequencies described above, and current (e.g., a current of 3 A or less) at respective frequencies is applied to the storage battery 41. Based on the measurement data of the current value at this time and the voltage value between the terminals, the internal resistance at each frequency is calculated.

As described above, for example, the accuracy of the degradation determination can be improved by measuring the internal resistance at a plurality of frequencies which are selected from at least one or more frequencies from each of the low frequency range of lower than 200 Hz and the high frequency range of 200 Hz or higher to lower than 2000 Hz. In addition, by further adding other frequencies in the above-mentioned frequency ranges and measuring the internal resistance, the accuracy can be further improved. In the present embodiment, for example, three kinds of frequencies selected from the high frequency range of about 1 kHz (e.g., 350 Hz or higher to lower than 2000 Hz, preferably 800 Hz or higher to lower than 1200 Hz), the low frequency range of lower than 100 Hz (which does not interfere with the commercial power source), and further, the intermediate frequency range (e.g., 100 Hz or higher to lower than 350 Hz) different from those frequency ranges are used to measure the internal resistance.

In order to confirm effects obtained by the measurement frequencies, an example of experimental results is indicated in a table below. In this example, the internal resistance of the storage battery was actually measured and the service life thereof was evaluated (battery capacity was estimated) for the respective cases in which the conventional measuring apparatus for internal resistance (which measures the resistance at a single frequency) was used and in which the state measuring device 30 of the present embodiment (in which the internal resistance measuring unit 34 measures the resistance at a plurality of frequencies) was used.

TABLE 1

| ITEMS | | CONVENTIONAL PRODUCT 1 | | CONVENTIONAL PRODUCT 2 | | CONVENTIONAL PRODUCT 3 | | DEVELOPED PRODUCT 1 | | DEVELOPED PRODUCT 2 | |
|---|---|---|---|---|---|---|---|---|---|---|---|
| MEASURING CONDITIONS | HIGH FREQUENCY RANGE | 350~2000 Hz | | | | | | 200~2000 Hz | | 350~2000 Hz | |
| | INTERMEDIATE FREQUENCY RANGE | | | 100~350 Hz | | | | | | 100~350 Hz | |
| | LOW FREQUENCY RANGE | | | | | 0~100 Hz | | 0~200 Hz | | 0~100 Hz | |

| BATTERY TYPE, ACTUAL CAPACITY AND ESTIMATED VALUE | BATTERY TYPE | RELATIVE RATIO (%) OF ACTUAL CAPACITY | | RELATIVE RATIO (%) OF ESTIMATED VALUE | | RELATIVE RATIO (%) OF ESTIMATED VALUE | | RELATIVE RATIO (%) OF ESTIMATED VALUE | | RELATIVE RATIO (%) OF ESTIMATED VALUE | | RELATIVE RATIO (%) OF ESTIMATED VALUE | |
|---|---|---|---|---|---|---|---|---|---|---|---|---|---|
| | | 5 HR | 1 CA | 5 HR | 1 CA | 5 HR | 1 CA | 5 HR | 1 CA | 5 HR | 1 CA | 5 HR | 1 CA |
| | BATTERY A | 100 | 100 | 105 | 98 | 105 | 105 | 95 | 105 | 100 | 100 | 100 | 100 |
| | BATTERY B | 90 | 95 | 95 | 90 | 100 | 100 | 100 | 100 | 90 | 95 | 90 | 95 |
| | BATTERY C | 95 | 75 | 90 | 95 | 80 | 80 | 80 | 80 | 95 | 80 | 95 | 75 |
| | BATTERY D | 80 | 40 | 85 | 80 | 60 | 60 | 50 | 50 | 80 | 45 | 80 | 40 |
| | BATTERY E | 100 | 85 | 95 | 100 | 90 | 90 | 90 | 90 | 100 | 80 | 100 | 85 |
| | BATTERY F | 95 | 60 | 90 | 95 | 70 | 70 | 70 | 70 | 100 | 60 | 95 | 60 |

| BATTERY TYPE AND ERROR BETWEEN ACTUAL CAPACITY AND ESTIMATED VALUE | BATTERY TYPE | RELATIVE RATIO (%) OF ACTUAL CAPACITY | | ERROR FROM ACTUAL CAPACITY | | ERROR FROM ACTUAL CAPACITY | | ERROR FROM ACTUAL CAPACITY | | ERROR FROM ACTUAL CAPACITY | | ERROR FROM ACTUAL CAPACITY | |
|---|---|---|---|---|---|---|---|---|---|---|---|---|---|
| | | 5 HR | 1 CA | 5 HR | 1 CA | 5 HR | 1 CA | 5 HR | 1 CA | 5 HR | 1 CA | 5 HR | 1 CA |
| | BATTERY A | 100 | 100 | 5 | 2 | 5 | 5 | 5 | 5 | 0 | 0 | 0 | 0 |
| | BATTERY B | 90 | 95 | 5 | 5 | 10 | 5 | 10 | 5 | 0 | 0 | 0 | 0 |
| | BATTERY C | 95 | 75 | 5 | 20 | 15 | 5 | 15 | 5 | 0 | 5 | 0 | 0 |
| | BATTERY D | 80 | 40 | 5 | 40 | 20 | 20 | 30 | 10 | 0 | 5 | 0 | 0 |
| | BATTERY E | 100 | 85 | 5 | 15 | 10 | 5 | 10 | 5 | 0 | 5 | 0 | 0 |
| | BATTERY F | 95 | 60 | 5 | 35 | 25 | 10 | 25 | 10 | 5 | 0 | 0 | 0 |
| APPLICABILITY OF RESPECTIVE ITEMS | ERROR SUBTOTAL | | | 30 | 117 | 85 | 50 | 95 | 40 | 5 | 15 | 0 | 0 |
| | ERROR TOTAL | | | 147 | | 135 | | 135 | | 20 | | 0 | |
| | MEASUREMENT TIME | | | 100 | | 500 | | 2500 | | 500 | | 300 | |
| | EVALUATION POINTS (TIME + ERROR × 10) | | | 1570 | | 1850 | | 3850 | | 700 | | 300 | |
| | EVALUATION | | | NORMAL | | INFERIOR | | DIFFICULTY IN APPLICATION | | GOOD | | EXCELLENT | |

The table 1 indicates the results of evaluation of the measurement accuracy based on an error between the actual battery capacity and the estimated battery capacity and time required for the measurement obtained by measuring the internal resistance of each of the storage batteries having different degradation states and estimating the battery capacity thereof by using the conventional products 1 to 3 and the developed products 1 and 2 as the measuring apparatus for internal resistance.

Here, the conventional products 1 to 3 are the measuring devices each of which measures the internal resistance at a single frequency according to the conventional technique, and the measurement frequencies of these measuring devices respectively belong to the different ranges (high frequency range (350 Hz or higher to lower than 2000 Hz), intermediate frequency range (100 Hz or higher to lower than 350 Hz), and low frequency range (lower than 100 Hz)). Meanwhile, the developed products 1 and 2 are the state measuring devices 30 of the present embodiment to measure the internal resistance at measurement frequencies which belong to a plurality of frequency ranges (high frequency range (200 Hz or higher to lower than 2000 Hz) and low frequency range (lower than 200 Hz) for the developed product 1 and high frequency range (350 Hz or higher to lower than 2000 Hz), intermediate frequency range (100 Hz or higher to lower than 350 Hz), and low frequency range (lower than 100 Hz) for the developed product 2).

In the experiments, six types of storage batteries (batteries A to F) have been fabricated as storage batteries to be used. These batteries are:
  battery A that is a new battery conforming to storage battery standard UP300-12 (12 V/100 Ah/5 HR);
  battery B fabricated by reducing the electrolytic solution of a battery equivalent to the battery A by 10%;
  battery C fabricated by subjecting a battery equivalent to the battery A to a trickle charge life test conducted at 25° C. which gives the battery an effect of degradation corresponding to a lapse of five years;
  battery D fabricated by subjecting a battery equivalent to the battery A to a trickle charge life test conducted at 25° C. which gives the battery an effect of degradation corresponding to a lapse of fifteen years;
  battery E fabricated by refilling a battery equivalent to the battery C with a decreased amount of the electrolytic solution; and
  battery F fabricated by refilling a battery equivalent to the battery D with a decreased amount of the electrolytic solution.

In the table, as the conditions of each of the above-mentioned batteries, based on the 5 HR capacity and 1 CA capacity, each actual capacity and the estimated capacity values obtained based on the measurement values of the internal resistance by the conventional products 1 to 3 and the developed products 1 and 2 are indicated by the relative ratios (%) to the fully charged state.

A storage battery in its fully charged state is prepared in accordance with JIS8704-02, and an actual measurement value of the discharge capacity (actual capacity) of each battery is based on this storage battery. In this case, the storage battery in its fully charged state means the storage battery charged with a limiting current of 13.38 V/10 A for 48 hours or longer. For the actual measurement value (actual capacity) of the 5 HR capacity, a storage battery after being charged is left in its open-circuit state in an atmosphere of 25±2° C. for 24 hours and the battery is then discharged with a discharge current value of 20 A at a temperature of 25±2° C., and the discharge capacity is obtained from a discharge duration time required to reach its final voltage of 10.5 V. Also, for the actual measurement value (actual capacity) of the 1 CA capacity, like the case of the 5 HR capacity mentioned above, a storage battery after being fully charged is left in an atmosphere of 25±2° C. for 24 hours and the battery is then discharged with a discharge current value of 100 A, and the discharge capacity is obtained from a discharge duration time required to reach its final voltage of 9.6 V. The relative ratio of the obtained actual measurement value of the discharge capacity of each storage battery to a discharge capacity of a new battery is calculated.

Also, in estimation of a capacity based on ae measurement value of an internal resistance, an experimental formula regarding a relation between the internal resistance and the discharge capacity (or discharge duration time) which is established as conventional knowledge based on accumulated experimental results is used. Specifically, since the relation between the measurement value of the internal resistance and the discharge capacity is expressed by a linear function, for example, the discharge capacity obtained by each of the conventional products 1 to 3 (which measures the internal resistance at a single frequency) is expressed by the following equation based on the measurement value of the internal resistance and the initial value of the internal resistance.

Discharge capacity=Initial value of discharge capacity×(1−(Measurement value of internal resistance−Initial value of internal resistance)/Initial value of internal resistance)

Therefore, the relative ratio to the discharge capacity of the new battery (initial value of discharge capacity) is calculated by the following equation.

Relative ratio=1−(Measurement value of internal resistance−Initial value of internal resistance)/Initial value of internal resistance Note that, in the case of measuring the internal resistance at a plurality of measurement frequencies like the developed products 1 and 2, for example, a weighted mean value obtained by giving a predetermined weight to two or three measured internal resistance values is applied to the above-mentioned equations. For example, in the case of the measurement in the low-rate discharge, a weight heavier than that for an internal resistance measured at a frequency in the intermediate frequency range is set for an internal resistance value measured at a frequency in the high frequency range. Also, in the case of the measurement in the high-rate discharge, a weight heavier than that for an internal resistance measured at a frequency in the high frequency range is set for an internal resistance value measured at a frequency in the intermediate frequency range, and further, a weight heavier than that for an internal resistance value measured at a frequency in the intermediate frequency range is set for an internal resistance value measured at a frequency in the low frequency range.

In table 1, with respect to each of the conventional products 1 to 3 and the developed products 1 and 2, an error between the estimated value (relative ratio) found based on the measured value of the internal resistance and the actual capacity (relative ratio) is found for the 5 HR capacity and the 1 CA capacity of each of the storage batteries. Moreover, based on a total of the respective errors and time required for the measurement of the internal resistance, an evaluation point is obtained for each product, so that the evaluation results are also indicated.

According to the evaluation results, it can be understood that the developed products 1 and 2 can generally estimate the battery capacity in a shorter time and with higher accuracy than the conventional products 1 to 3 (which each measure the internal resistance at a single frequency). It is also understood that the developed product 2 (which measures the internal resistance at three kinds of frequencies) can estimate the battery capacity in a much shorter time and with much higher accuracy than the developed product (which measures the internal resistance at two kinds of frequencies).

<Process Flow in State Measuring Device (Slave Device)>

Figure 4:
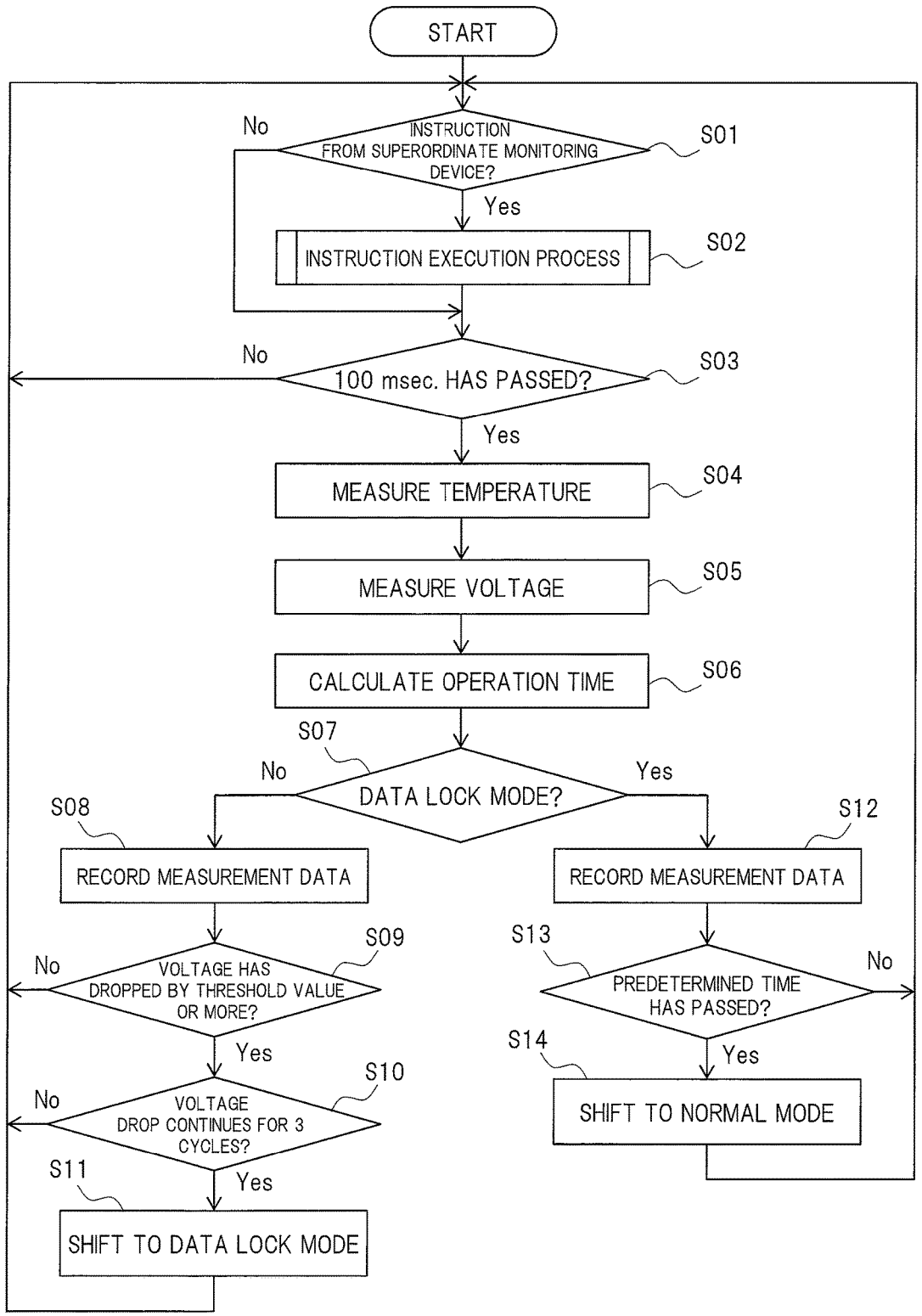
FIG. 4 is a flow chart showing an outline of an example of a process flow in a measurement control unit of the state measuring device (slave device) according to the one embodiment of the present invention.

FIG. 4 is a flow chart showing an outline of an example of a process flow in the measurement control unit 31 of the state measuring device (slave device) 30. When the slave device 30 is activated to start measuring processes of various parameters of the storage battery 41, it is first determined whether an instruction has been received from the superordinate monitoring device 10 via the master device 20 (S01). When the instruction has been received, an instruction execution process specified by the instruction from the superordinate monitoring device 10 is executed (S02). The instruction execution process at step S02 will be described later, and in this case, processes transmitting various measurement data to the superordinate monitoring device 10 are mainly carried out. At this time, a measuring process of an internal resistance of the storage battery 41 is also carried out by the internal resistance measuring unit 34, if necessary.

When no instruction has been received from the superordinate monitoring device 10 at step S01, it is next determined whether a predetermined interval of time has passed from the previous measurement cycle (S03). This predetermined interval is the interval at which the slave device 30 regularly measures the parameters of the storage battery 41 and is set to, for example, 100 msec. in the present embodiment. Note that the value of the interval may be, for example, the value specified by the superordinate monitoring device 10 via the master device 20 or a value set as a default value in advance to the slave device 30, and the value may be stored in the internal memory 37 or the like in advance to be referred to at the activation of the slave device 30 or other specific timing.

When 100 msec. has not passed at step S03, the flow returns to step S01 and the process is repeated. Instead of step S01, the flow may return to step S03 to wait until 100 msec. passes. When 100 msec. has passed at step S03, the temperature of the storage battery 41 is measured by the temperature measuring unit 32 (S04), and a voltage between the terminals of the storage battery 41 is measured by the voltage measuring unit 33 (S05). At this time, if there is a resistance measuring instruction from the superordinate monitoring device 10, a voltage is measured by applying a current (e.g., 3 A or less) at a predetermined frequency generated by the sine wave generation unit 35 to the storage battery 41.

Thereafter, an operation time of the subject storage battery 41 is calculated (S06). In this case, for example, the passed time from the previous measuring time is summed up to calculate an integrated time and record the time. A conversion time obtained in accordance with the Arrhenius rule (for example, based on the temperature measured at step S04) may also be recorded at the same time.

When the temperature, the voltage, and the internal resistance are measured by the temperature measuring unit 32, the voltage measuring unit 33, and the internal resistance measuring unit 34, and when the measurement control unit 31 acquires the measurement data, it is determined whether the current mode is a data lock mode in which the recording is carried out in a state where the measurement data is locked in such away that it is not overwritten (S07). When the current mode is not the data lock mode but is a normal mode, the measurement data of the temperature, the voltage, and the internal resistance is recorded together with a time stamp in the internal memory 37 (S08). When there is the data locked in the internal memory 37, the measurement data is recorded so as not to delete the locked data by overwriting it.

Further, in the following step, a process to determine whether the storage battery 41 has started discharging or charging by analyzing the measured voltage data is carried out. The storage battery 41 incorporated in the power supply device 40 is controlled so as to maintain a constant voltage in a normal situation. Meanwhile, when the power supply device 40 is in operation to start supplying power to a load, that is, the storage battery 41 starts discharging, the voltage of the storage battery 41 drops sharply and then gradually decreases as the discharging goes on (note that the voltage changes inversely when the power supply device 40 stops supplying power to the load and charging to the storage battery 41 is started).

Figure 5:
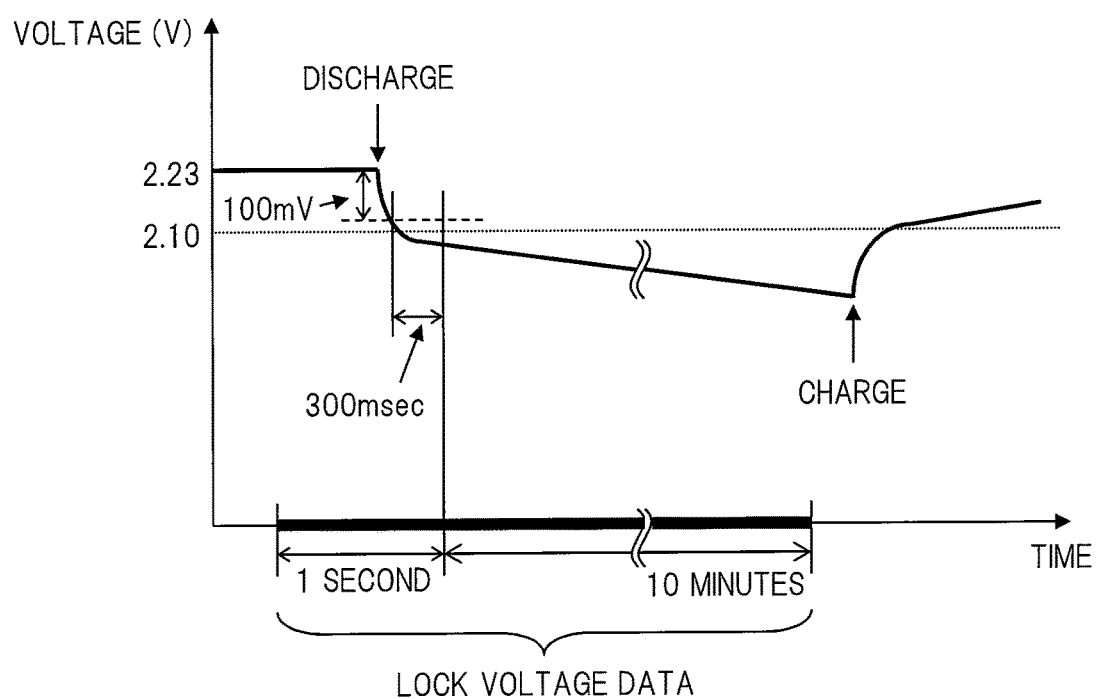
FIG. 5 is a diagram showing an outline of an example indicating a voltage change at the time of discharging/charging of a storage battery according to the one embodiment of the present invention.

FIG. 5 is a diagram showing an outline of an example indicating a voltage change at the time of discharging/charging of the storage battery 41. In this case, FIG. 5 indicates a case of discharging and charging of a unit cell of the storage battery 41 byway of example, in which a voltage per unit cell in the normal situation (e.g., 2.23 V) drops sharply to about 2.1 V or lower when the discharging is started and then gradually decreases with an almost constant slope. Therefore, in the present embodiment, for example, when the state where the voltage has dropped from its normal voltage by 100 mV or more per one cell is continued for consecutive three measurement cycles (300 msec.), it is determined that discharging is started.

As described above, since a large DC current flows through the storage battery 41 during the discharging, more detailed information of the state of the storage battery 41 can be obtained based on the parameter measurement data at this time. Therefore, as shown in FIG. 5, as the data during the discharging, the measurement data of voltage (which may include temperature data) in a certain time range before and after a point of time when the discharging is detected (a time range enough to calculate a change rate (slope) during a gradual decrease of the voltage) is recorded in the internal memory 37 in a locked state in such a way that the recorded data is not lost by being overwritten or deleted by other measurement data (the data during the charging may also be locked in the same manner).

In the present embodiment, for example, data in a time range from 1 second before to 10 minutes after a point of time when the discharging is detected is locked. Note that, although this time range can be determined appropriately in accordance with the capacity of the internal memory 37, a communication load for data transmission, use conditions of the power supply device 40, and the like, it is preferable to store and lock the data in a time range of one minute or more after the point of time when the discharging or charging is detected.

For carrying out the above-mentioned process, in the process flow of FIG. 4, it is first determined whether the measurement value of voltage data has dropped (or risen) from that in the normal situation by a predetermined threshold value (e.g., 100 mV per cell in the present embodiment) or more (S09). Note that, in order to detect a sharp voltage drop, it may also be determined whether the measurement value has dropped from the previously measured value by the predetermined threshold value or more.

When the voltage has not dropped by the predetermined threshold value or more at step S09, the flow returns to step S01 and repeats the measurement process. When the voltage has dropped by the predetermined threshold value or more at step S09, it is next determined whether the voltage drop has continued for a predetermined time (S10). In the present embodiment, it is determined whether the voltage drop has continued for three measurement cycles (300 msec.). When the voltage drop does not continue for three measurement cycles, the flow returns to step S01 and repeats the measurement process. Meanwhile, when the voltage drop has continued for three measurement cycles, the mode is shifted to the data lock mode in which the measurement data is locked (S11). At this time, for example, voltage data (which may include temperature data) recorded in the internal memory 37 within past one second is locked, for example, by setting a flag indicating that overwriting or deletion of the data is forbidden. Subsequently, the flow returns to step S01 and repeats the measurement process.

Meanwhile, when the current mode at step S07 is the data lock mode, the measurement data of the temperature, the voltage, and the internal resistance is recorded together with a time stamp in the internal memory 37 after setting the flag indicating that the measurement data is locked (S12). Note that, although the internal memory 37 preferably has a capacity sufficient to store the locked data (measurement data in a time range of about ten minutes in the present embodiment), for example, when the capacity of the internal memory 37 is insufficient and the internal memory 37 is saturated with locked data and has no extra area to record new data therein, an error message or a warning may be sent to the superordinate monitoring device 10 via the station device 20.

Thereafter, it is determined whether a predetermined time (ten minutes in the present embodiment) has passed from a point of time when a continuous voltage drop (detection of discharging of the storage battery 41) has been detected for consecutive three cycles at step S10 (that is, equivalent to a point of time when the mode has been shifted to the data lock mode) (S13). When ten minutes has not passed, the flow returns to step S01 and repeats the measurement process.

Meanwhile, when ten minutes has passed, the data lock mode is shifted to the normal mode (S14), and the flow returns to step S01 to repeat the measurement process. More specifically, measurement data in the subsequent cycles is recorded in the internal memory 37 as unlocked data by the process at steps following step S08. Note that, even when the data lock mode is shifted to the normal mode, measurement data recorded in a locked state in the past is stored in the locked state until it is transmitted to the superordinate monitoring device 10 via the master device 20 as described later.

As shown in FIG. 4, in the present embodiment, the measurement data to be locked is locked by setting a flag thereto, but a data locking method is not limited to this. For example, when a continuous voltage drop for consecutive three cycles (discharging of the storage battery 41 is detected) is detected at step S10, by calculating a time stamp at one second before the point of time of the detection and a time stamp at ten minutes after the point of time of the detection and storing the respective time stamps as information of a lock start time and a lock ending time, whether the measurement data is to be locked may be determined depending on whether the measurement data is included within the time range. Alternatively, a memory area for locked data and a memory area for unlocked data may be separated from each other in the internal memory 37 (in this case, the process in which unlocked data recorded within past one second is moved to the memory area for the locked data is carried out).

Furthermore, in the process flow shown in FIG. 4, the process based on an instruction from the superordinate monitoring device 10 at steps S01 to S02 and the parameter measurement process by the slave device 30 at step S03 and subsequent steps are described as sequential processes for the sake of convenience, but the processing order is not limited to this. Also, the reception of an instruction from the superordinate monitoring device 10, the passage of the measurement cycle of 100 msec., or the like may be implemented as an event-driven process by using them as a trigger of generation of an event.

Figure 6:
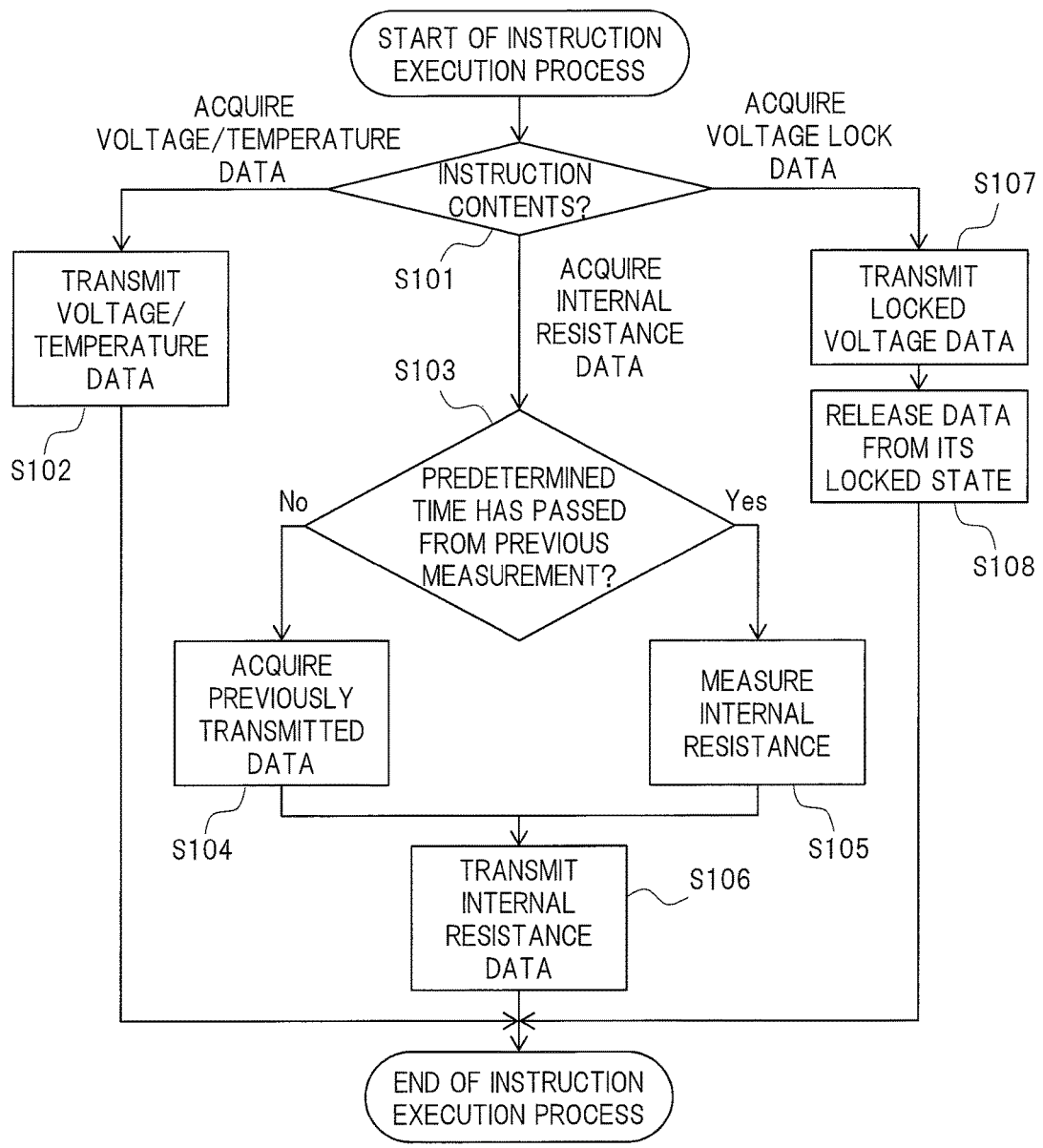
FIG. 6 is a flow chart showing an outline of an example of a flow of an instruction execution process according to the one embodiment of the present invention.

FIG. 6 is a flow chart showing an outline of an example of a flow of the instruction execution process at step S02 in the measurement process by the slave device 30 shown in FIG. 4. When having received an instruction from the superordinate monitoring device 10, the measurement control unit 31 first determines the contents of the instruction (S101) and executes a process in accordance with the contents.

When the contents of the instruction received at step S101 are a request for acquiring the measurement data of the voltage and the temperature, the measurement data of the voltage and the temperature recorded and accumulated in the internal memory 37 after the previous transmission of measurement data to the superordinate monitoring device 10 (the latest data measured at every 100 msec. by the process at step S04 and subsequent steps of FIG. 4) and data for operation time are transmitted to the superordinate monitoring device 10 via the master device 20 (S102) to end the process. Note that, in the present embodiment, the superordinate monitoring device 10 allows the monitor controlling unit 12 to automatically and regularly transmit the request for acquiring the above-mentioned data at a predetermined interval (e.g., every five minutes) set in the setting information 15 or the like. The transmitted measurement data may be deleted from the internal memory 37. When the transmitted measurement data is not deleted from the internal memory 37, for example, a time stamp for the latest one of the transmitted measurement data is stored in such a way that the measurement data which has been transmitted can be distinguished from measurement data which has not been transmitted.

When the contents of the instruction received at step S101 are a request for acquiring measurement data of the internal resistance of the storage battery 41, it is determined whether a predetermined time (e.g., one hour in the present embodiment) has passed from the previous measurement time of the internal resistance (S103). Note that, in the present embodiment, the superordinate monitoring device 10 allows the monitor controlling unit 12 to automatically and regularly transmit a request for acquiring the measurement data at a predetermined cycle (e.g., once a day) set in the setting information 15 or the like. Also, in addition to this, the request for acquiring the measurement data can be transmitted based on an instruction input manually by the user.

When one hour or more has not passed from the previous measurement time at step S103, in order to avoid the case where an unnecessary load is applied to the storage battery 41 due to the measurement process of the internal resistance carried out consecutively in a short time (e.g., the user repeats input of instructions to the superordinate monitoring device 10 consecutively in a short time), the measurement of the internal resistance is not carried out. At this time, in the present embodiment, the measurement data of the internal resistance obtained at the previous measurement is read out from the internal memory 37 (S104) and is transmitted as measurement data (S106).

Meanwhile, when one hour or more has passed from the previous measurement time at step S103, the internal resistance of the storage battery 41 is measured by the internal resistance measuring unit 34 (S105), and the flow proceeds to step S106. Here, as described above, sine waves of a plurality of frequencies are generated by the sine wave generation unit 35 and the current (e.g., 3 A or less) at each frequency is applied to the storage battery 41, and the internal resistance at each frequency is calculated based on the measurement data of the current value and the voltage value between the terminals. In the present embodiment, as described above, the plurality of frequencies include at least the high frequency of about 1 kHz and the low frequency of lower than 100 Hz and may further include an additional different frequency. The obtained data of the internal resistance is recorded in the internal memory 37.

Thereafter, the measurement data of the internal resistance is transmitted to the superordinate monitoring device 10 via the master device 20 (S106) to end the process. Note that, depending on a time required for measuring the internal resistance at step S105, for example, in response to the instruction of measuring the internal resistance received once a day, the measurement process of the internal resistance at step S105 is executed, and the data of previous measurement result recorded in the internal memory 37 may also be transmitted (one day later) to the superordinate monitoring device 10 at step S106 asynchronously with the measurement process of the internal resistance at step S105.

When the contents of the instruction at step S101 are a request for acquiring the locked voltage data (which may include temperature data) measured during the discharging or charging of the storage battery 41, the locked measurement data of voltage (and temperature) is acquired from the internal memory 37 and transmitted to the superordinate monitoring device 10 via the master device 20 (S107).

Note that, in the present embodiment, the superordinate monitoring device 10 transmits a request for acquiring locked voltage data based on an instruction input manually by the user. For example, the user can know that the operation of the power supply device 40 (discharging of the storage battery 41) is started based on the information obtained from the control/power supply device 50 through the superordinate monitoring device 10, and then, the user instructs to acquire the locked voltage data after waiting for a recovery from a failure of the like. Since the superordinate monitoring device 10 can acquire a DC current value during the discharging of the storage battery 41 from the control/power supply device 50, the degradation determining unit 13 can calculate a DC resistance value based on these data.

Thereafter, transmitted data is released from its locked state (S108) to end the process. The data released from its locked state becomes ordinary data that can be overwritten. The data may be deleted from the internal memory 37 instead of being released from its locked state.

Note that instructions from the superordinate monitoring device 10 include an instruction to set various types of setting information (e.g., information of the measurement interval of the temperature and the voltage measured at a fixed interval and information of the time range during which the measurement data of the voltage is locked when discharging of the storage battery 41 is detected based on a voltage drop), in addition to the request to measure the parameters and request to acquire the measurement data described above. The setting contents specified by the instruction are recorded in the internal memory 37, for example, and are referred to by the measurement control unit 31.

Also, the instructions may include an instruction of an operation mode such as the power-saving mode in which circuits of each unit and the like remain sleeping except a time when needed and an instruction to stop the slave device 30. For example, when receiving a stop instruction, the measurement process is ended and the operation of the device is stopped. Instead of stopping, the mode may be shifted to the sleep mode, the stand-by mode, or the like. The slave device 30 may be designed to be returned from the sleep mode or the stand-by mode upon reception of a return instruction from the superordinate monitoring device 10 as a trigger.

<Process Flow in Superordinate Monitoring Device>

Figure 7:
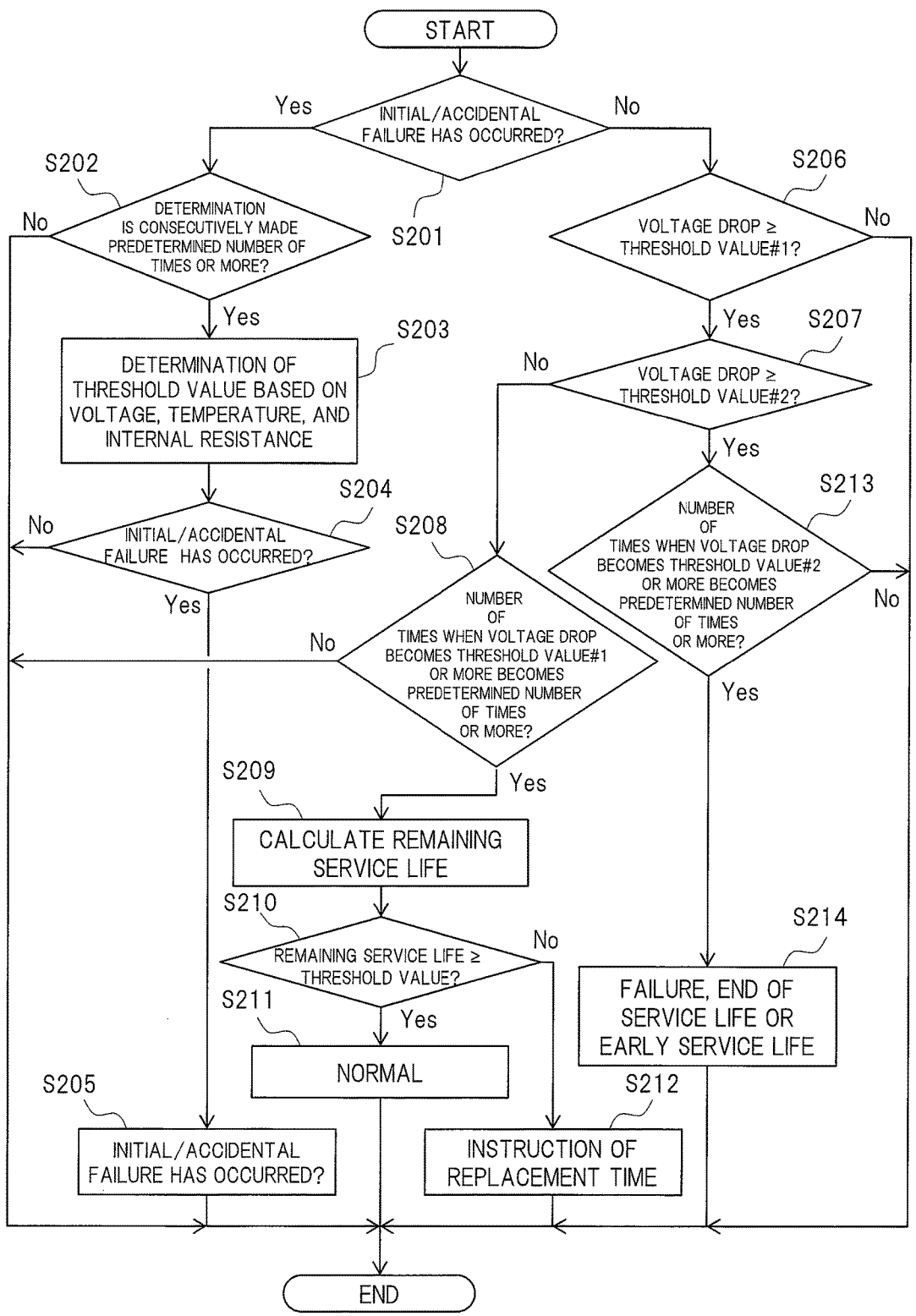
FIG. 7 is a flow chart showing an outline of an example of a process flow in a degradation determining unit in the superordinate monitoring device according to the one embodiment of the present invention.

FIG. 7 is a flow chart showing an outline of an example of a process flow in the degradation determining unit 13 in the superordinate monitoring device 10. In the superordinate monitoring device 10, for example, at a predetermined interval such as every five minutes, or at a time when the measurement data is acquired from the state measuring device (slave device) 30, or at a time when an instruction from the user is received via the interface unit 11, a preliminary determination whether an initial failure/accidental failure occurs is first made by using a rough determination reference based on the measurement data accumulated in the measurement history 14 (S201). Accordingly, in the cases that the initial failure/accidental failure does not occur clearly, a detailed determination to be carried out thereafter becomes unnecessary.

As described earlier, with respect to an unexpected trouble, such as an initial failure/accidental failure, as the management of the abnormal values, for example, determination is made based on whether the value of the temperature or the voltage of the storage battery 41 exceeds a predetermined threshold value obtained from the average value or the like. More specifically, when the temperature of the storage battery 41 exceeds the room temperature by +10° C., it is determined that the storage battery 41 is in a slight abnormal state, and when the temperature of the storage battery 41 exceeds the room temperature by +20° C., it is determined that the storage battery 41 is in a state where immediate replacement is needed.

When it is determined that an initial failure/accidental failure has occurred at step S201, it is determined whether the corresponding determination is consecutively made a predetermined number of times (for example, three times) or more (S202). When the corresponding determination is not consecutively made the predetermined number of times or more, the process ends. Conversely, when the corresponding determination is consecutively made the predetermined number of times or more, determination of the threshold value is next made in a more detailed manner based on the values of the voltage, the temperature, the internal resistance, and the like of the measurement data (S203), and it is determined whether an initial failure/accidental failure has occurred (S204). When it is determined that an initial/accidental failure has not occurred, the process ends.

When it is determined that an initial failure/accidental failure has occurred at step S204, it is acknowledged that the initial/accidental failure has occurred in the corresponding storage battery 41 (S205), and accordingly, the process ends. At this time, for example, the occurrence of the failure may be recorded as an event and may be imparted to the user via the interface unit 11. Alternatively, an instruction may be output to the control/power supply device 50 or the like so as to carry out a fallback operation by disconnecting the subject storage battery 41.

Meanwhile, when it is determined at step S201 that there is no initial failure/accidental failure, determination is made whether degradation over time is present, and estimation of remaining service life is carried out. In this case, first, with respect to the measured voltage data, it is determined whether a voltage drop (or a DC resistance obtained based on the voltage drop and the current value) is a first threshold value (in the drawing, described as "threshold value #1") or more (S206). When the voltage drop is less than the first threshold value, the process ends. The first threshold value is set based on a less strict reference in comparison with a second threshold value to be described later. Accordingly, in the cases that are clearly considered to be normal from the viewpoint of degradation over time, detailed determination to be carried out thereafter becomes unnecessary.

When the voltage drop is the first threshold value or more, it is further determined whether the voltage drop is a second threshold value (in the drawing, described as "threshold value #2") or more (S207). Note that the second threshold value is a value greater than the first threshold value, and these values can be obtained from the characteristic curve of the storage battery 41; however, these values may be appropriately set based on the operation time (may be based on the conversion time in accordance with the Arrhenius rule), a setting voltage (average voltage), a state of a load, or the like.

When the voltage drop is less than the second threshold value at step S207, that is, when the voltage drop is between the first threshold value and the second threshold value, it is next determined whether the number of times when the voltage drop becomes the first threshold value or more becomes a predetermined number of times (for example, three times) or more (S208). When the number of times does not become the predetermined number of times or more, the process ends. When the number of times becomes the predetermined number of times or more, the remaining service life of the storage battery 41 is calculated (S209). In this case, for example, by using the above-mentioned technique, the battery capacity is estimated based on the internal resistances or the like measured at a plurality of frequencies and the remaining service life is calculated. At this time, for example, a usable period is calculated based on the remaining service life and displayed on a screen via the interface unit 11 together with information of the operation time at the current point of time, so that the user may be informed of the above information.

Thereafter, it is determined whether the remaining service life calculated at step S209 is a predetermined threshold value (for example, one year) or more (S210). When the remaining service life is the threshold value or more, it is determined that the storage battery 41 is normal (S211), and the process ends. When the remaining service life is less than the threshold value, it is determined that the replacement time is close, and a screen display of the scheduled replacement time (for example, set to one year as an approximate plan) is given via the interface unit 11 to inform the user (S212), thereby ending the process.

Meanwhile, when the voltage drop is the second threshold value or more at step S207 as well, it is next determined whether the number of times when the voltage drop becomes the second threshold value or more becomes a predetermined number of times (for example, three times) or more (S213). When the number does not become the predetermined number of times or more, the process ends. When the number becomes the predetermined number of times or more, it is determined that the storage battery 41 has a failure or has reached the end of service life (including an early service life) (S214), thereby ending the process. At this time, a screen display may be given via the interface unit 11 to inform the user.

As described above, according to the storage battery state monitoring system 1 of the one embodiment of the present invention, with respect to the plurality of storage batteries 41 constantly connected to the apparatus, by automatically measuring or acquiring parameters including the voltage, the internal resistance, the DC resistance in discharging/charging in addition to the temperature, as well as by measuring the internal resistance at a plurality of frequencies, it becomes possible to estimate the state and the service life of each storage battery 41 with high accuracy. At this time, by determining the initial failure and the accidental failure in a distinguished manner from degradation over time and taking these into consideration comprehensively, it becomes possible to estimate the state and the service life of the storage battery 41 with higher accuracy.

Moreover, by using a hierarchical configuration constituted by the superordinate monitoring device 10, the master device 20, and the slave devices 30 carrying out wireless communication between the master device 20 and the slave devices 30, it becomes possible to efficiently carry out measurements of the various parameters of a large number of storage batteries 41.

At this time, each slave device 30 measures various parameters in accordance with the setting contents or the like from the superordinate monitoring device 10 to transmit the resulting data to the superordinate monitoring device 10 via the master device 20, also automatically detects discharging/charging of the storage battery 41, and stores the measurement data of the voltage in discharging/charging in a locked state so as not to be lost by being overwritten or the like, so that it becomes possible to monitor a voltage change caused by a DC current in units of the slave device 30 and to estimate the state and the service life of each of the storage batteries 41 more securely with higher accuracy.

In the foregoing, the invention made by the inventors of the present invention has been concretely described based on the embodiment. However, it is needless to say that the present invention is not limited to the foregoing embodiment and various modifications and alterations can be made within the scope of the present invention. For example, the embodiment is described in detail to simplify the description of the present invention. Thus, it is not always necessary to provide all the described configurations. Alternatively, the configuration of the embodiment may partially allow the addition of other configurations, deletion, and replacement.

For example, in the present embodiment, it is configured in such a way that data measured by the slave device 30 is transmitted to the superordinate monitoring device 10 via the master device 20 and the state of degradation of the storage battery 41 is determined in the superordinate monitoring device 10; however, the present invention is not intended to be limited by this configuration. By causing a CPU installed on a dedicated device such as the slave device 30 or the like to directly execute a software program which corresponds to the degradation determining unit 13 of the superordinate monitoring device 10 and the measurement control unit 31 of the slave device 30 and executes processes in the respective units as a sequence of processes, it is also possible to provide a configuration in which all the processes are completed in the slave device 30. In contrast, it is also possible to provide a configuration in which only simple measurements may be carried out in the slave device 30 by introducing the corresponding software program into the master device 20 or a general-purpose information processing terminal such as another PC or a tablet terminal to be executed, and by using a flexible system configuration, the state of degradation of the storage battery 41 can be determined.

INDUSTRIAL APPLICABILITY

The present invention can be applied to a storage battery state monitoring system, a storage battery state monitoring method, and a storage battery state monitoring program in which a state of a storage battery constantly connected to an apparatus is monitored and estimated by applying power to the storage battery, for use in backup power, output fluctuation, or the like.

EXPLANATION OF REFERENCE CHARACTERS

1 . . . storage battery state monitoring system, 10 . . . superordinate monitoring device, 11 . . . interface unit, 12 . . . monitoring control unit, 13 . . . degradation determining unit, 14 . . . measurement history, 15 . . . setting information, 20 . . . data relay device (master device), 30 . . . state measuring device (slave device), 31 . . . measurement control unit, 32 . . . temperature measuring unit, 33 . . . voltage measuring unit, 34 . . . internal resistance measuring unit, 35 . . . sine wave generation unit, 36 . . . communication unit, 37 . . . internal memory, 38 . . . external memory, 39 . . . temperature sensor, 40 . . . power supply device, 41 . . . storage battery, 50 . . . control/power supply device, 60 . . . network

The invention claimed is:

1. A storage battery state monitoring system which monitors a state of each of a plurality of storage batteries connected in series and constituting an assembled battery provided in an apparatus, the system comprising:

current detecting means which detects a current in each of the storage batteries;

a plurality of slave devices compose of state measuring means which measures an operation time, a temperature, a voltage, and an internal resistance of each of the storage batteries, the internal resistance being measured at at least two or more kinds of frequencies and each directly connected to each of one or more of the plurality of storage batteries;

a superordinate monitoring device which acquires data detected or measured by the current detecting means and/or the state measuring means and estimates degradation of each of the storage batteries based on the acquired data; and one or more of master devices which relay communication between the superordinate monitoring device and each of the plurality of slave devices, wherein the one or more of the master devices are connected to the superordinate monitoring device so as to enable communication therebetween, and one or more of the plurality of slave devices are connected to each of the one or more master devices so as to enable communication therebetween, and wherein a state that is not normal in each of the storage batteries is determined by distinguishing an initial failure or an accidental failure from degradation over time based on at least one or more values of the temperature, the voltage, and the internal resistance measured by the state measuring means and a direct current resistance of each of the storage batteries obtained from a ratio between a change in a current value detected by the current detecting means and a change in a voltage value measured by the state measuring means during discharging of each of the storage batteries.

2. The storage battery state monitoring system according to claim 1, wherein, when it is determined for every measurement time whether a state is a first state in which at least one or more values of respective parameters of the temperature, the voltage, the internal resistance, and the direct current resistance obtained in each of the storage batteries exceeds an average value of the respective parameters by a predetermined threshold value or more, it is determined whether the first state continues a predetermined measurement number of times or more, and the first state continues, it is determined that the initial failure or the accidental failure occurs in the corresponding storage battery, and when it is determined that the initial failure or the accidental failure does not occur, the degradation over time is determined based on the value of the internal resistance obtained in each of the storage batteries.

3. The storage battery state monitoring system according to claim 2, wherein the state measuring means measures the internal resistance of each of the storage batteries at at least the two or more kinds of frequencies each including a first frequency of lower than 200 Hz and a second frequency of 200 Hz or higher to lower than 2000 Hz.

4. The storage battery state monitoring system according to claim 3, wherein the state measuring means measures the internal resistance of each of the storage batteries at three kinds of frequencies including a first frequency of lower than 100 Hz, a second frequency of 350 Hz or higher to lower than 2000 Hz, and further a third frequency of 100 Hz or higher to lower than 350 Hz is measured.

5. The storage battery state monitoring system according to claim 1, wherein the state measuring means measures the internal resistance of each of the storage batteries at at least the two or more kinds of frequencies each including a first frequency of lower than 200 Hz and a second frequency of 200 Hz or higher to lower than 2000 Hz.

6. The storage battery state monitoring system according to claim 5, wherein the state measuring means measures the internal resistance of each of the storage batteries at three kinds of frequencies including a first frequency of lower than 100 Hz, a second frequency of 350 Hz or higher to lower than 2000 Hz, and further a third frequency of 100 Hz or higher to lower than 350 Hz.

7. A storage battery state monitoring method in a storage battery state monitoring system which monitors a state of each of a plurality of storage batteries connected in series and constituting an assembled battery provided in an apparatus, the storage battery state monitoring system including:

current detecting means which detects a current in each of the storage batteries;

a plurality of slave devices composed of state measuring means which measures an operation time, a temperature, a voltage, and an internal resistance of each of the storage batteries, the internal resistance being measured at at least two or more kinds of frequencies and each directly connected to the storage battery;

a superordinate monitoring device which acquires data detected or measured by the current detecting means and/or the state measuring means and estimates degradation of each of the storage batteries based on the acquired data; and one or more of master devices which relays communication between the superordinate monitoring device and each of the plurality of slave devices, the one or more of master devices being connected to the superordinate monitoring device so as to enable communication therebetween, and one or more of the plurality of slave devices being connected to each of the one or more master devices so as to enable communication therebetween, and the storage battery state monitoring method comprising:

a current detecting step which detects a current in each of the storage batteries;

a state measuring step which measures an operation time, a temperature, a voltage, and an internal resistance of each of the storage batteries, the internal resistance being measured at at least two or more kinds of frequencies; and a degradation determining step of determining a state that is not normal in each of the storage batteries by distinguishing an initial failure or an accidental failure from degradation over time based on at least one or more values of the temperature, the voltage, and the internal resistance measured in the state measuring step and a direct current resistance of each of the storage batteries obtained from a ratio between a change in a current value detected in the current detecting step and a change in a voltage value measured in the state measuring step during discharging of each of the storage batteries.

8. The storage battery state monitoring method according to claim 7, wherein, in the degradation determining step, when it is determined for every measurement time whether a state is a first state in which at least one or more values of respective parameters of the temperature, the voltage, the internal resistance, and the direct current resistance obtained in each of the storage batteries exceeds an average value of the respective parameters by a predetermined threshold value or more, it is determined whether the first state continues a predetermined measurement number of times or more, and the first state continues, it is determined that the initial failure or the accidental failure occurs in the corresponding storage battery, and when it is determined that the initial failure or the accidental failure does not occur, the degradation over time is determined based on the value of the internal resistance obtained in each of the storage batteries.

9. The storage battery state monitoring method according to claim 8,
wherein, in the state measuring step, the internal resistance of each of the storage batteries at at least the two or more kinds of frequencies each including a first frequency of lower than 200 Hz and a second frequency of 200 Hz or higher to lower than 2000 Hz is measured.

10. The storage battery state monitoring method according to claim 9,
wherein, in the state measuring step, the internal resistance of each of the storage batteries at three kinds of frequencies including a first frequency of lower than 100 Hz, a second frequency of 350 Hz or higher to lower than 2000 Hz, and further a third frequency of 100 Hz or higher to lower than 350 Hz is measured.

11. The storage battery state monitoring method according to claim 7,
wherein, in the state measuring step, the internal resistance of each of the storage batteries at at least the two or more kinds of frequencies each including a first frequency of lower than 200 Hz and a second frequency of 200 Hz or higher to lower than 2000 Hz is measured.

12. The storage battery state monitoring method according to claim 11,
wherein, in the state measuring step, the internal resistance of each of the storage batteries at three kinds of frequencies including a first frequency of lower than 100 Hz, a second frequency of 350 Hz or higher to lower than 2000 Hz, and further a third frequency of 100 Hz or higher to lower than 350 Hz is measured.

13. A computer readable storage medium storing a storage battery state monitoring program causing a computer to execute processes so as to function as a storage battery state monitoring system which monitors a state of each of a plurality of storage batteries connected in series and constituting an assembled battery provided in an apparatus, the storage battery state monitoring system including:
current detecting means which detects a current in each of the storage batteries;
a plurality of slave devices composed of state measuring means which measures an operation time, a temperature, a voltage, and an internal resistance of each of the storage batteries, the internal resistance being measured at at least two or more kinds of frequencies and each directly connected to the storage battery;
a superordinate monitoring device which acquires data detected or measured by the current detecting means and/or the state measuring means and estimates degradation of each of the storage batteries based on the acquired data; and
one or more of master devices which relays communication between the superordinate monitoring device and the slave device,
the one or more of master devices being connected to the superordinate monitoring device so as to enable communication therebetween, and one or more of the plurality of slave devices being connected to each of the one or more of master devices so as to enable communication therebetween, and
the storage battery state monitoring program causing the computer to execute:
a current detecting process of detects a current in each of the storage batteries;
a state measuring process of measures an operation time, a temperature, a voltage, and an internal resistance of each of the storage batteries, the internal resistance being measured at at least two or more kinds of frequencies; and
a degradation determining process of determining a state that is not normal in each of the storage batteries by distinguishing an initial failure or an accidental failure from degradation over time based on at least one or more values of the temperature, the voltage, and the internal resistance measured by the state measuring process and a direct current resistance of each of the storage batteries obtained from a ratio between a change in a current value detected by the current detecting process and a change in a voltage value measured by the state measuring process during discharging of each of the storage batteries.

14. The computer readable storage medium according to claim 13,
wherein, in the degradation determining process, when it is determined for every measurement time whether a state is a first state in which at least one or more values of respective parameters of the temperature, the voltage, the internal resistance, and the direct current resistance obtained in each of the storage batteries exceeds an average value of the respective parameters by a predetermined threshold value or more, it is determined whether the first state continues a predetermined measurement number of times or more, and the first state continues, it is determined that the initial failure or the accidental failure occurs in the corresponding storage battery, and when it is determined that the initial failure or the accidental failure does not occur, the degradation over time is determined based on the value of the internal resistance obtained in each of the storage batteries.

15. The computer readable storage medium according to claim 14,
wherein, in the state measuring process, the internal resistance of each of the storage batteries at at least the two or more kinds of frequencies each including a first frequency of lower than 200 Hz and a second frequency of 200 Hz or higher to lower than 2000 Hz is measured.

16. The computer readable storage medium according to claim 15,
wherein, in the state measuring process, the internal resistance of each of the storage batteries at three kinds of frequencies including a first frequency of lower than 100 Hz, a second frequency of 350 Hz or higher to lower than 2000 Hz, and further a third frequency of 100 Hz or higher to lower than 350 Hz is measured.

17. The computer readable storage medium according to claim 13,
wherein, in the state measuring process, the internal resistance of each of the storage batteries at at least the two or more kinds of frequencies each including a first frequency of lower than 200 Hz and a second frequency of 200 Hz or higher to lower than 2000 Hz is measured.

18. The computer readable storage medium according to claim 17,
wherein, in the state measuring process, the internal resistance of each of the storage batteries at three kinds of frequencies including a first frequency of lower than 100 Hz, a second frequency of 350 Hz or higher to lower than 2000 Hz, and further a third frequency of 100 Hz or higher to lower than 350 Hz is measured.

* * * * *